(12) United States Patent
Wang et al.

(10) Patent No.: US 9,442,378 B2
(45) Date of Patent: Sep. 13, 2016

(54) TOUCH PANEL AND MANUFACTURING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Deshuai Wang, Beijing (CN); Lianjie Qu, Beijing (CN)

(73) Assignees: BOE Technology Group, Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 28 days.

(21) Appl. No.: 14/407,223

(22) PCT Filed: May 9, 2014

(86) PCT No.: PCT/CN2014/077142
§ 371 (c)(1),
(2) Date: Dec. 11, 2014

(87) PCT Pub. No.: WO2015/078146
PCT Pub. Date: Jun. 4, 2015

(65) Prior Publication Data
US 2015/0346602 A1 Dec. 3, 2015

(30) Foreign Application Priority Data

Nov. 27, 2013 (CN) .......................... 2013 1 0616927

(51) Int. Cl.
| G06F 3/041 | (2006.01) |
|---|---|
| G03F 7/20 | (2006.01) |
| G03F 7/32 | (2006.01) |
| G03F 7/16 | (2006.01) |
| G06F 3/044 | (2006.01) |

(52) U.S. Cl.
CPC . *G03F 7/32* (2013.01); *G03F 7/16* (2013.01); *G03F 7/20* (2013.01); *G03F 7/2022* (2013.01); *G06F 3/041* (2013.01); *G06F 3/044* (2013.01); *G06F 2203/04103* (2013.01)

(58) Field of Classification Search
CPC .......... G03F 7/32; G03F 7/20; G03F 7/2002; G03F 7/16; G06F 2203/04103; G06F 3/044; G06F 3/041
USPC ......................... 430/312, 317, 318, 319, 321
See application file for complete search history.

(56) References Cited

U.S. PATENT DOCUMENTS

2010/0026661 A1* 2/2010 Teramoto ................ G06F 3/044
345/174

FOREIGN PATENT DOCUMENTS

| CN | 102866816 A | 1/2013 |
|---|---|---|
| CN | 102981676 A | 3/2013 |
| CN | 103019496 A | 4/2013 |

OTHER PUBLICATIONS

Computer-generated translation of CN 102866816 (Jan. 2013).*
International Search Report, International Preliminary Report on Patentability and Written Opinion of the International Searching Authority of PCT/CN2014/077142 in Chinese, mailed Aug. 19, 2014.
English translation of the International Preliminary Report on Patentability and Written Opinion of the International Searching Authority of PCT/CN2014/077142, issued May 31, 2016.

* cited by examiner

*Primary Examiner* — John A McPherson
(74) *Attorney, Agent, or Firm* — Collard & Roe, P.C.

(57) ABSTRACT

A manufacturing method of a touch panel, comprising forming a pattern of a metal connecting layer, a pattern of an insulating layer, a pattern of a driving electrode, a pattern of a sensing electrode and a pattern of a protective layer on a substrate; the pattern of the insulating layer and the pattern of the protective layer are formed through the same mask. With this method, the number of masks used during manufacture of the touch panel can be decreased, and the production cost is reduced. A touch panel is further disclosed.

15 Claims, 4 Drawing Sheets

TOUCH PANEL AND MANUFACTURING METHOD THEREOF

CROSS REFERENCE TO RELATED APPLICATIONS

This application is the National Stage of PCT/CN2014/077142 filed on May 9, 2014, which claims priority under 35 U.S.C. §119 of Chinese Application No. 201310616927.3 filed on Nov. 27, 2013, the disclosure of which is incorporated by reference.

TECHNICAL FIELD

Embodiments of the present invention relate to a touch panel and a manufacturing method thereof.

BACKGROUND

Currently, touch panel displays have been developed rapidly, and have become the mainstream of the flat panel displays gradually. A sectional view of a pixel region and a peripheral drive region of a touch panel is shown in FIG. 1, and the touch panel comprises a pattern of a metal connecting layer 4 formed on a substrate 7, a pattern of an insulating layer 5 on the pattern of the metal connecting layer 4, a pattern of a driving electrode 2 that is provided on the pattern of the insulating layer 5 and is connected to the pattern of the metal connecting layer 4 through a via-hole in the pattern of the insulating layer 5, a pattern of a sensing electrode 1 on the pattern of the insulating layer 5, and a pattern of a protective layer 6 that is provided to cover the pattern of the driving electrode 2 and the pattern of the sensing electrode 1. A via-hole is formed in the protective layer 6 in the peripheral drive region, so that the driving electrode 2 exposed by the via-hole is connected to a peripheral drive circuit (not shown); there is no via-hole in the protective layer 6 in the pixel region, and a downward concave happens to the protective layer 6 in the region as shown in FIG. 1. The reason for this is that there are steps in the level (the lower level) under the protective layer 6, and thus the protective layer 6 in the pixel region will be concaved downward to a certain degree.

The manufacturing process of the above touch panel is usually as follows:

Firstly, a layer of metal thin film is formed on a substrate and patterned with a mask so as to form pattern of a metal connecting layer 4.

Secondly, a layer of non-metal thin film is deposited on the substrate 7 with pattern of the metal connecting layer 4 formed thereon, and is patterned with a mask so as to form the pattern of an insulating layer 5; a via-hole in the insulating layer 5 in the pixel region is smaller, and a via-hole in the insulating layer 5 in the peripheral drive region is relatively larger.

Next, a layer of thin film of a transparent conductive material is formed on the substrate further, and is patterned to form the pattern of a driving electrode 2 and the pattern of a sensing electrode 1 through a mask.

Finally, a layer of non-metal thin film is formed, and subjected to an exposure and development process with a mask, and etched to form a pattern of a protective layer 6. Here, the portion of the mask corresponding to the pixel region of the substrate is light-proof, and only the portion of the mask corresponding to the peripheral drive region of the substrate is transparent to light.

As can be seen, four masks are demanded in the manufacturing procedure of the above touch panel for patterning processes, the number of required masks is larger, and the production cost is relatively high.

SUMMARY

According to at least one embodiment of the present invention, there are provided a touch panel and a manufacturing method thereof, capable of decreasing the number of mask during manufacture and saving the production cost.

According to at least one embodiment of the invention, there is provided a manufacturing method of a touch panel, which comprises forming pattern of a metal connecting layer, a pattern of an insulating layer, a pattern of a driving electrode, a pattern of a sensing electrode and a pattern of a protective layer on a substrate; the pattern of the insulating layer and the pattern of the protective layer are formed through a same mask.

According to at least one embodiment of the invention, there is further provided a touch panel, comprising a pattern of a metal connecting layer, a pattern of an insulating layer, a pattern of a driving electrode and a pattern of a sensing electrode, a pattern of a protective layer; and the pattern of the insulating layer and the pattern of the protective layer are produced by using the above method.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

Figure 1:
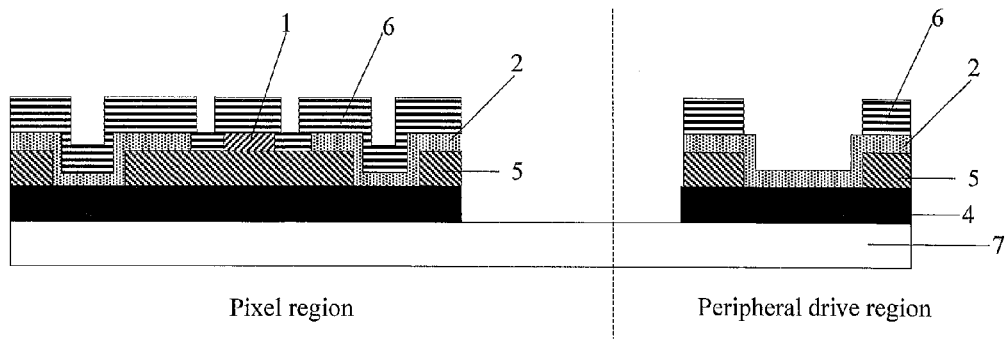
FIG. 1 is a sectional view illustrating a pixel region and a peripheral drive region of a touch panel.

REFERENCE NUMERALS 1-sensing electrode; 2-driving electrode; 3-half-transparent film;
4-metal connecting layer; 5-insulating layer; 6-protective layer;
7-substrate; 8, 80-ultraviolet light; 9-second mask;

10-photosensitive material;
11-light-exposure portion of the photosensitive material.

DETAILED DESCRIPTION

In at least one embodiment of the present invention, the pattern of the insulating layer 5 and the pattern of the protective layer 6 are produced by using a same mask, so that the production cost can be reduced.

Further detailed descriptions will be given below in connection with accompanied drawings In each of the drawings, the area on the left side of the dotted line is a pixel region, and that on the right side of the dotted line is a peripheral drive region. In one display screen, generally a pixel region is formed in the central part, and a peripheral drive region is formed on one or more sides of the pixel region.

Figure 2:
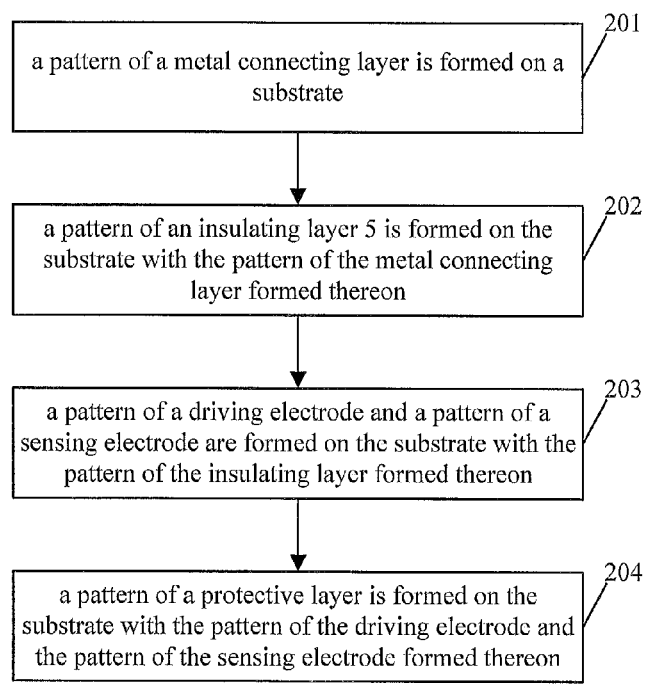
FIG. 2 is a schematic flowchart illustrating a manufacturing method of a touch panel according to an embodiment of the invention.

FIG. 2 is a schematic flowchart illustrating a manufacturing method of a touch panel according to an embodiment of the invention. As shown in FIG. 2, the method comprises the following steps.

Step 201, a pattern of a metal connecting layer is formed on a substrate.

Figure 3:
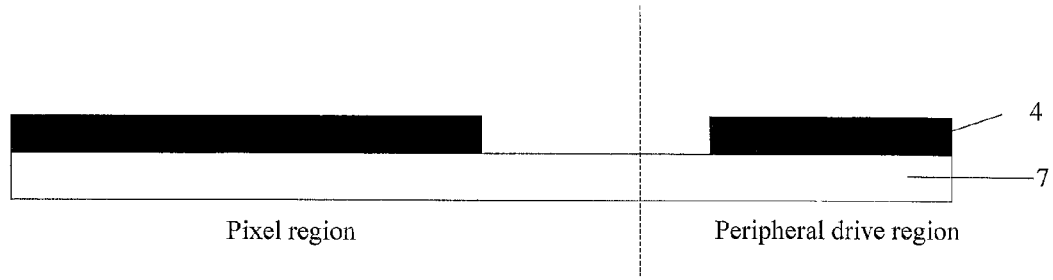
FIG. 3 is a structurally schematic view illustrating a substrate after formation of a metal connecting layer according to an embodiment of the invention.

For example, a layer of metal thin film is deposited on a substrate 7, and subjected to a patterning process. One example of the patterning process comprising exposure through a first mask, development and etching is conducted, so as to form a pattern of a metal connecting layer 4, as shown in FIG. 3. The substrate 7 is such as a glass substrate, a plastic substrate or the like.

Step 202, a pattern of an insulating layer 5 is formed on the substrate with the pattern of the metal connecting layer formed thereon.

For example, firstly, a layer of non-metal (e.g., silicon nitride) thin film is deposited on the substrate 7 with the pattern of the metal connecting layer 4 formed thereon, and a photosensitive material (e.g., a photoresist or a photosensitive resin) is coated on the non-metal thin film.

Here, a positive photoresist is used for example, that is, the photoresist is not soluble to a developing solution as it is, but converted into a soluble substance after exposure so as to expose the structure in a light-exposure region of the substrate. Accordingly, a photoresist fully-removed region is formed on the substrate in correspondence with a transmissive region of a mask used in at least one embodiment of the invention, and a photoresist fully-retained region is formed on the substrate in correspondence with an opaque (light-proof) region of the mask.

Figure 4:
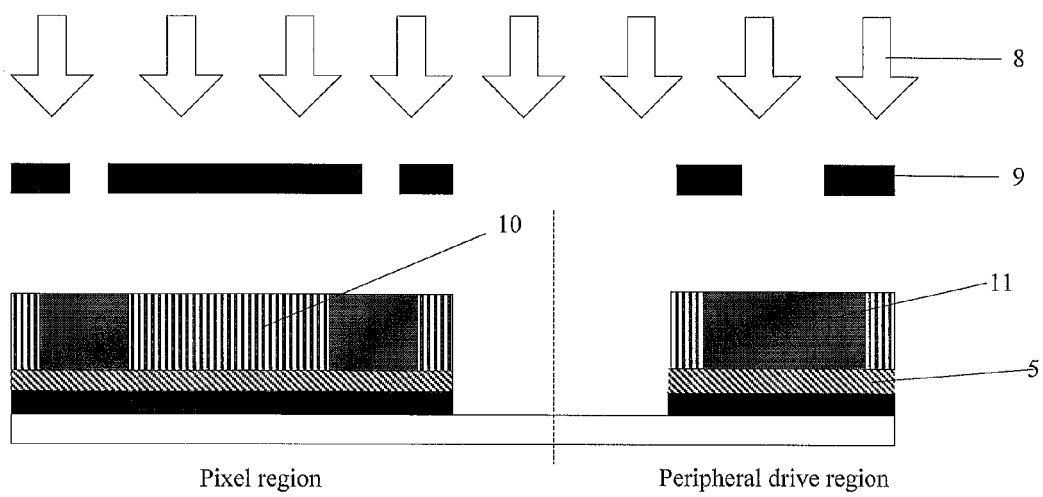
FIG. 4 is a schematic view illustrating a patterning method of an insulating layer according to an embodiment of the invention.

Next, as shown in FIG. 4, exposure and development are conducted on the photosensitive material 10 with a second mask 9, so as to form a fully-removed region for the photosensitive material in a region corresponding to the pattern of an insulating layer 5. For example, the height of the second mask 9 from the photosensitive material 10 is about 1152 mm; the thickness and the amount of exposure of the photosensitive material 10 are adjusted, for allowing the photosensitive material 10 corresponding to via-holes in the insulating layer 5 to be exposed fully. The thickness of the photosensitive material 10 is in the range of 2 to 3 μm, and because the relationship between the thickness and the amount of exposure is not linear, the range of the amount of exposure given here is from 30 mj to 60 mj. The light-exposure portion 11 of the photosensitive material is shown in FIG. 4. Here, the amount of exposure can be adjusted by means of changing the scanning speed of the light source for emitting ultraviolet light 8, such as, between 100 mm/s and 200 mm/s. The faster the scanning speed is, the smaller the amount of exposure is provided; and on the contrary, the greater the amount of exposure is provided.

Figure 5:
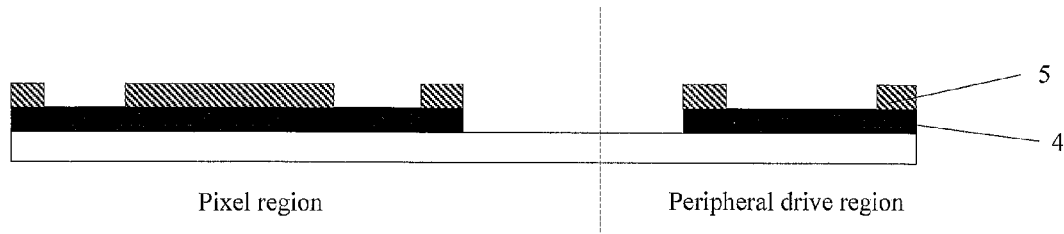
FIG. 5 is a structurally schematic view illustrating a substrate after formation of an insulating layer according to an embodiment of the invention.

Finally, development and etching are carried out, so as to obtain the pattern of the insulating layer 5, as shown in FIG. 5. The size of the via-hole in the insulating layer 5 in correspondence with the pixel region is smaller, usually in the range of 2 to 3 μm; and the size of the via-hole in correspondence with the peripheral drive region is larger, usually in the range of 4 to 6 μm.

Step 203, a pattern of a driving electrode and a pattern of a sensing electrode are formed on the substrate with the pattern of the insulating layer formed thereon.

Figure 6:
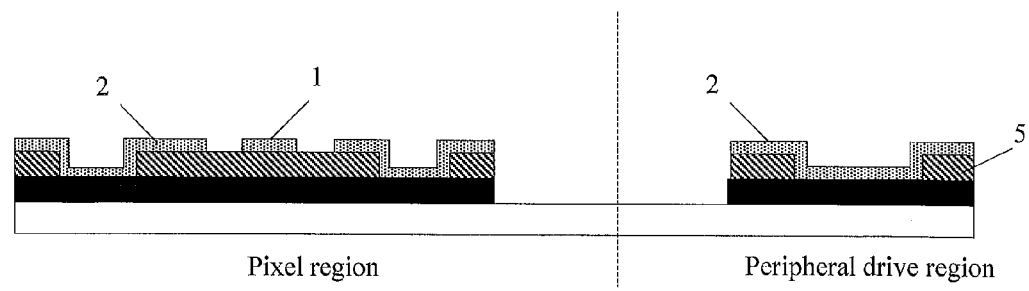
FIG. 6 is a structurally schematic view illustrating a substrate after formation of pattern of a driving electrode and a sensing electrode according to an embodiment of the invention.

For example, a layer of thin film of a transparent conductive material, such as an indium tin oxide (ITO) thin film, is deposited on the substrate with the pattern of the insulating layer 5 formed thereon, and is subjected to exposure through a third mask, development and etching, so as to form the pattern of a driving electrode 2 and the pattern of a sensing electrode 1, as shown in FIG. 6.

Step 204, a pattern of a protective layer is formed on the substrate with the pattern of the driving electrode and the pattern of the sensing electrode formed thereon.

Figure 7:
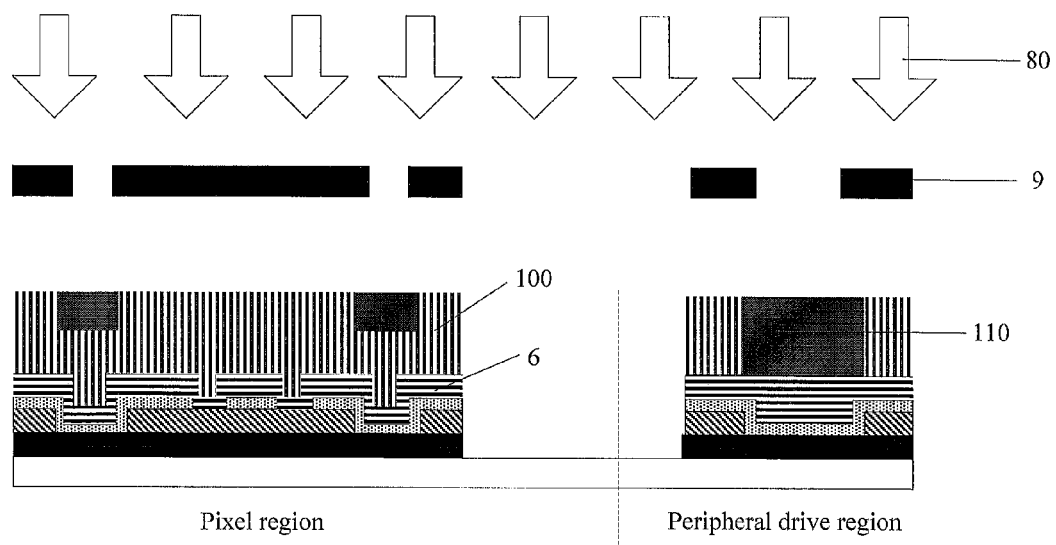
FIG. 7 is a schematic view illustrating a patterning method of a protective layer according to an embodiment of the invention.

For example, firstly, a layer of non-metal (e.g., SiNx or the like may be selected) thin film is deposited on the substrate with the pattern of the driving electrode and the pattern of the sensing electrode formed thereon, and a photosensitive material 10 (e.g., a photoresist) is coated on the non-metal thin film Secondly, as shown in FIG. 7, exposure with a second mask 9 and development are conducted upon the photosensitive material 100 so as to form a fully-removed region for the photosensitive material in a region in correspondence with pattern of the protective layer 6 in the peripheral drive region, and to form a partial-retained region in a region in correspondence with the pattern of the protective layer 6 in the pixel region. Here, the thickness and the amount of exposure of the photosensitive material 100 can be adjusted by means of changing the scanning speed of a light source for emitting ultraviolet light 80. The thickness of the photosensitive material 100 is in the range of 2 to 3 μm, and because the relationship between the thickness and the amount of exposure is not linear, the range of the amount of exposure given here is from 20 mj to 30 mj, and the scanning speed of the light source is in the range of 200 mm/s to 300 mm/s. It is realized that the photosensitive material 100 in correspondence with the via-hole in the periphery region is fully exposed, and the photosensitive material 100 in correspondence with the via-hole in the protective layer 6 in the pixel region is partially exposed. A light-exposure portion 110 of the photosensitive material is shown in FIG. 7.

At last, development and etching are carried out, so as to obtain the pattern of the protective layer 6. As shown in FIG. 1, a via-hole is formed in the protective layer 6 in the peripheral drive region, and no via-hole is formed in the protective layer 6 in the pixel region.

Figure 8:
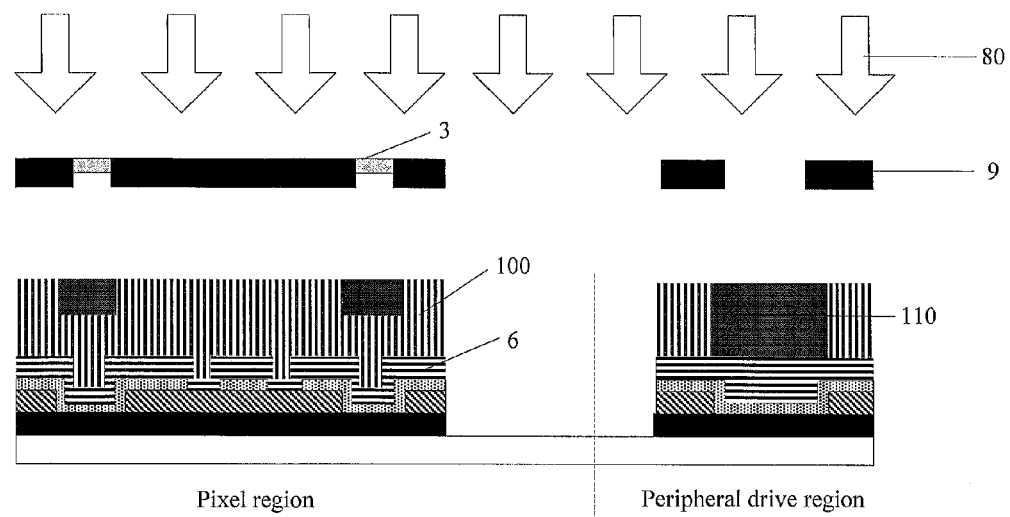
FIG. 8 is a schematic view illustrating a patterning method of a protective layer according to another embodiment of the invention.

According to at least one embodiment of the invention, there is further provided a manufacturing method of another touch panel. The processes for forming pattern of an insulating layer 5 and the pattern of a driving electrode and the pattern of a sensing electrode are the same as the foregoing, and details are omitted here. A same mask is used for forming the pattern of the insulating layer 5 and the pattern of the protective layer 6, and the portion corresponding to a via-hole in the insulating layer in the pixel region is half-transparent (e.g., light transmittance is 50%), and this half-transparent can be achieved by arranging a translucent membrane at a corresponding location, as shown in FIG. 8.

During manufacture, during the process of forming the pattern of the insulating layer 5, the thickness (2-3 μm) of the photosensitive material 10 and the scanning speed (100-200 mm/s) of the light source are adjusted, for allowing the photosensitive material 10 corresponding to the via-holes in the insulating layer 5 to be exposed fully. When the pattern of the protective layer 6 is formed, the thickness (2-3 μm) of the photosensitive material 10 and the scanning speed (200-300 mm/s) of the light source are adjusted, so as to form a fully-removed region of the photosensitive material in a region in correspondence with the pattern of the protective layer 6 in the peripheral drive region, and to form a partial-retained region in a region in correspondence with the pattern of the protective layer 6 in the pixel region, as shown in FIG. 8.

According to at least one embodiment of the invention, there is further provided a manufacturing method of a touch panel, which comprises forming a pattern of a metal connecting layer on a substrate through a first mask, forming a pattern of an insulating layer through a second mask, forming a pattern of a driving electrode and a pattern of a sensing electrode through a third mask; and forming a pattern of a protective layer through the second mask again.

According to at least one embodiment of the invention, there is further provided a touch panel, comprising a pattern of a metal connecting layer, a pattern of an insulating layer, a pattern of a driving electrode and a pattern of a sensing electrode, a pattern of a protective layer. The pattern of the insulating layer and the pattern of the protective layer are produced by using the method as stated above.

According to at least one embodiment of the invention, there is further provided a touch panel display, comprising an individual layer of touch panel as stated above.

With respect to the touch panel and the manufacturing method thereof provided by at least one embodiment of the invention, the method comprises forming a pattern of a metal connecting layer, a pattern of an insulating layer, a pattern of a driving electrode, a pattern of a sensing electrode and a pattern of a protective layer on a substrate; the pattern of the insulating layer and the pattern of the protective layer are formed through the same mask. The masks used in patterning processes can be reduced from the original four masks to three masks in the course of manufacturing the touch panel according to embodiments of the invention, so that the number of mask can be decreased. Thus, the production cost is reduced.

The foregoing are merely exemplary embodiments of the invention, but are not used to limit the protection scope of the invention.

This application claims the benefit of priority from Chinese patent application No. 201310616927.3, filed on Nov. 27, 2013, the disclosure of which is incorporated herein in its entirety by reference as a part of the present application.

The invention claimed is:

1. A manufacturing method of a touch panel, comprising forming a pattern of a metal connecting layer, a pattern of an insulating layer, a pattern of a driving electrode, a pattern of a sensing electrode and pattern of a protective layer on a substrate;

wherein the pattern of the insulating layer and the pattern of the protective layer are formed through a same insulating mask, wherein the step of forming a pattern comprises:

forming the pattern of the metal connecting layer on the substrate through a first mask;

forming the pattern of the insulating layer through the insulating mask;

forming the pattern of the driving electrode and the pattern of the sensing electrode on the insulating layer through a second mask in one exposure, development and etching process; and forming the pattern of the protective layer through the insulating mask.

2. The method claimed as claim 1, wherein formation of the insulating layer comprises:

depositing a layer of non-metal thin film on the substrate with the pattern of the metal connecting layer formed thereon, and coating a first photosensitive material on the non-metal thin film;

performing exposure with the insulating mask and development on the first photosensitive material, so as to form a fully-removed region of the first photosensitive material in a region in correspondence with the pattern of the insulating layer;

wherein the first photosensitive material corresponding to a via-hole in the non-metal thin film is fully exposed by means of adjusting a thickness and an amount of exposure of the first photosensitive material.

3. The method claimed as claim 2, wherein the thickness of the first photosensitive material is in the range of 2 to 3 μm.

4. The method claimed as claim 3, wherein formation of the pattern of the protective layer comprises:

depositing a layer of non-metal thin film on the substrate with the pattern of the driving electrode and the pattern of the sensing electrode formed thereon, and coating a second photosensitive material on the non-metal thin film;

performing exposure with the insulating mask and development on the second photosensitive material, so as to form a fully-removed region of the second photosensitive material in a region in correspondence with pattern of the protective layer in a peripheral drive region, and to form a partial-retained region of the second photosensitive material in a region in correspondence with pattern of the protective layer in a pixel region;

wherein, the second photosensitive material corresponding to a via-hole in the peripheral drive region is fully exposed, and the second photosensitive material corresponding to a via-hole in the protective layer in the pixel region is partially exposed, by means of adjusting a thickness and an amount of exposure of the second photosensitive material.

5. The method claimed as claim 4, wherein the thickness of the second photosensitive material is in the range of 2 to 3 μm.

6. The method claimed as claim 4, wherein a scanning speed of a light source for exposure is adjusted to be in the range of 200 to 300 mm/s, so as to adjust the amount of exposure.

7. The method claimed as claim 2, wherein a scanning speed of a light source for exposure is adjusted to be in a range of 100 to 200 mm/s, so as to adjust the amount of exposure.

8. The method claimed as claim 7, wherein formation of the pattern of the protective layer comprises:

depositing a layer of non-metal thin film on the substrate with the pattern of the driving electrode and the pattern of the sensing electrode formed thereon, and coating a second photosensitive material on the non-metal thin film;

performing exposure with the insulating mask and development on the second photosensitive material, so as to form a fully-removed region of the second photosensitive material in a region in correspondence with pattern of the protective layer in a peripheral drive region, and to form a partial-retained region of the second photosensitive material in a region in correspondence with pattern of the protective layer in a pixel region;

wherein, the second photosensitive material corresponding to a via-hole in the peripheral drive region is fully exposed, and the second photosensitive material corresponding to a via-hole in the protective layer in the pixel region is partially exposed, by means of adjusting a thickness and an amount of exposure of the second photosensitive material.

9. The method claimed as claim 8, wherein the thickness of the second photosensitive material is in the range of 2 to 3 μm.

10. The method claimed as claim 8, wherein a scanning speed of a light source for exposure is adjusted to be in the range of 200 to 300 mm/s, so as to adjust the amount of exposure.

11. The method claimed as claim 2, wherein formation of the pattern of the protective layer comprises:
depositing a layer of non-metal thin film on the substrate with the pattern of the driving electrode and the pattern of the sensing electrode formed thereon, and coating a second photosensitive material on the non-metal thin film;
performing exposure with the insulating mask and development on the second photosensitive material, so as to form a fully-removed region of the second photosensitive material in a region in correspondence with pattern of the protective layer in a peripheral drive region, and to form a partial-retained region of the second photosensitive material in a region in correspondence with pattern of the protective layer in a pixel region;

wherein, the second photosensitive material corresponding to a via-hole in the peripheral drive region is fully exposed, and the second photosensitive material corresponding to a via-hole in the protective layer in the pixel region is partially exposed, by means of adjusting a thickness and an amount of exposure of the second photosensitive material.

12. The method claimed as claim 11, wherein the thickness of the second photosensitive material is in the range of 2 to 3 μm.

13. The method claimed as claim 11, wherein a scanning speed of a light source for exposure is adjusted to be in the range of 200 to 300 mm/s, so as to adjust the amount of exposure.

14. The method claimed as claim 11, wherein the portion corresponding to the via-hole in the insulating layer in the pixel region is provided with a translucent membrane and is half-transparent.

15. The method claimed as claim 1, wherein a portion of the insulating mask corresponding to a via-hole in the insulating layer in a pixel region is half transparent.

* * * * *